(12) United States Patent
Ramaswamy et al.

(10) Patent No.: US 11,710,513 B2
(45) Date of Patent: Jul. 25, 2023

(54) INTEGRATED ASSEMBLIES HAVING FERROELECTRIC TRANSISTORS AND METHODS OF FORMING INTEGRATED ASSEMBLIES

(71) Applicant: Micron Technology, Inc., Boise, ID (US)

(72) Inventors: Durai Vishak Nirmal Ramaswamy, Boise, ID (US); Kamal M. Karda, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/696,052

(22) Filed: Mar. 16, 2022

(65) Prior Publication Data

US 2023/0041784 A1 Feb. 9, 2023

Related U.S. Application Data

(60) Provisional application No. 63/229,166, filed on Aug. 4, 2021.

(51) Int. Cl.
*G11C 11/22* (2006.01)
*H10B 51/00* (2023.01)

(52) U.S. Cl.
CPC ........ *G11C 11/223* (2013.01); *G11C 11/2277* (2013.01); *H10B 51/00* (2023.02)

(58) Field of Classification Search
None
See application file for complete search history.

(56) References Cited

U.S. PATENT DOCUMENTS

| | | | |
|---|---|---|---|
| 9,875,784 B1 * | 1/2018 | Li | H01L 29/516 |
| 11,069,410 B1 * | 7/2021 | Cui | H01L 27/11587 |
| 2017/0358599 A1 | 12/2017 | Ramaswamy et al. | |
| 2019/0123061 A1 * | 4/2019 | Liu | G11C 11/2275 |
| 2021/0036020 A1 | 2/2021 | Park et al. | |
| 2021/0066318 A1 | 3/2021 | Chang | |
| 2021/0066502 A1 | 3/2021 | Karda et al. | |
| 2021/0074726 A1 * | 3/2021 | Lue | H10B 51/30 |
| 2021/0175254 A1 * | 6/2021 | Van Houdt | H10B 51/00 |
| 2021/0202703 A1 | 7/2021 | Rajashekhar et al. | |

OTHER PUBLICATIONS

Ma et al., "Why is Nonvolatile Ferroelectric Memory Field-Effect Transistor Still Elusive?", IEEE Electron Device Letters vol. 23, No. 7, Jul. 2002, United States, pp. 386-388.
Dunkel et al., "A FeFET Based Super-Low-Power Ultra-Fast Embedded NVM Technology for 22nm FDSOI and Beyond", IEEE International Electron Devices Meeting (IEDM), Dec. 2017, United States, 4 pages.

(Continued)

*Primary Examiner* — Tan T. Nguyen
(74) *Attorney, Agent, or Firm* — Wells St. John P.S.

(57) ABSTRACT

Some embodiments include a ferroelectric transistor having a conductive gate structure, a first ring extending around the conductive gate structure and a second ring extending around the first ring. The first ring includes ferroelectric material. The second ring includes insulative material. A mass of channel material is outward of the second ring. Some embodiments include integrated assemblies and methods of forming integrated assemblies.

35 Claims, 16 Drawing Sheets

(56) References Cited

OTHER PUBLICATIONS

Trentzsch et al., "A28nm HKMG Super Low Power Embedded NVM Technology Based on Ferroelectric FETs", IEEE International Electron Devices Meeting (IEDM), Dec. 2016, United States, 4 pages.
WO PCT/US2022/037732 Search Rept., Nov. 10, 2022, Micron Technology, Inc.
WO PCT/US2022/037732 Writ. Opin., Nov. 10, 2022, Micron Technology, Inc.

* cited by examiner

INTEGRATED ASSEMBLIES HAVING FERROELECTRIC TRANSISTORS AND METHODS OF FORMING INTEGRATED ASSEMBLIES

RELATED PATENT DATA

This application claims priority to and the benefit of U.S. Provisional Patent Application Ser. No. 63/229,166, filed Aug. 4, 2021, the disclosure of which is incorporated herein by reference.

TECHNICAL FIELD

Integrated Assemblies having ferroelectric transistors. Methods of forming integrated assemblies.

BACKGROUND

Memory is one type of integrated circuitry and is used in computer systems for storing data. Memory may be fabricated in one or more arrays of individual memory cells. Memory cells may be written to, or read from, using digit lines (which may also be referred to as bitlines, data lines, sense lines, or data/sense lines) and access lines (which may also be referred to as wordlines). The digit lines may conductively interconnect memory cells along columns of the array, and the access lines may conductively interconnect memory cells along rows of the array.

Memory cells may be volatile or nonvolatile. Nonvolatile memory cells can store data for extended periods of time including when the computer is turned off. Volatile memory dissipates and therefore requires being refreshed/rewritten, in many instances multiple times per second. Regardless, memory cells are configured to retain or store memory in at least two different selectable states. In a binary system, the states are considered as either a "0" or a "1". In other systems, at least some individual memory cells may be configured to store more than two levels or states of information.

Ferroelectric field effect transistors (FeFET) may be utilized as memory cells. Specifically, the FeFETs may have two selectable memory states corresponding to two different polarization modes of ferroelectric material within the FeFETS. The different polarization modes may be characterized by, for example, different threshold voltages (Vt) or by different channel conductivities for a selected operating voltage. The ferroelectric polarization mode of a FeFET may remain in the absence of power (at least for a measurable duration).

One type of ferroelectric transistor is a metal-ferroelectric-metal-insulator-semiconductor (MFMIS) transistor. Such has a gate dielectric (insulator, I) between metal (M) and a semiconductor substrate (S). Such also has ferroelectric (F) material over the metal, and has a gate (typically comprising metal, M) over the ferroelectric material. In operation, an electric field across the ferroelectric material is used to switch the ferroelectric material from one polarization mode to another. The ferroelectric transistor comprises a pair of source/drain regions, and a channel region between the source/drain regions. Conductivity across the channel region is influenced by the polarization mode of the ferroelectric material. Another type of ferroelectric transistor is metal-ferroelectric-insulator-semiconductor (MFIS) in which ferroelectric material directly touches the insulator (i.e., in which there is no intervening metal between the ferroelectric material and the insulator).

It is desired to develop ferroelectric transistors which are scalable to ever-increasing levels of integration.

DETAILED DESCRIPTION OF THE ILLUSTRATED EMBODIMENTS

Some embodiments include ferroelectric transistors configured to include rings (donuts) of ferroelectric material extending around vertically-extending wordline structures. The ferroelectric transistors may be incorporated into memory, with each of the ferroelectric transistors corresponding to a memory cell. Some embodiments include methods of forming ferroelectric transistors, and methods of forming memory comprising ferroelectric transistors. Example embodiments are described with reference to FIGS. 1-15.

Figure 1B:
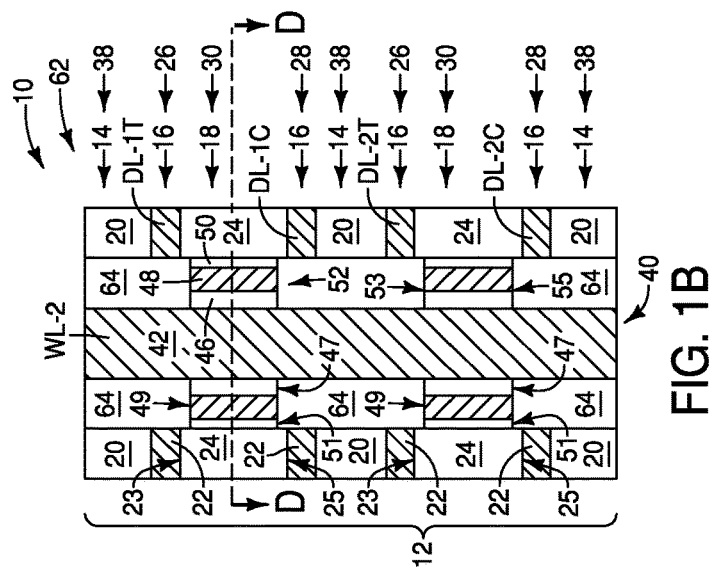
FIGS. 1-1D are diagrammatic views of a region of an example integrated assembly. The view of FIG. 1 is a top-down view and the view of FIG. 1D is a top-down sectional view. The views of FIGS. 1A-1C are cross-sectional side views along the lines A-A, B-B and C-C of FIGS. 1 and 1D. The view of FIG. 1D is along the lines D-D of FIGS. 1A-1C.
Figure 1:
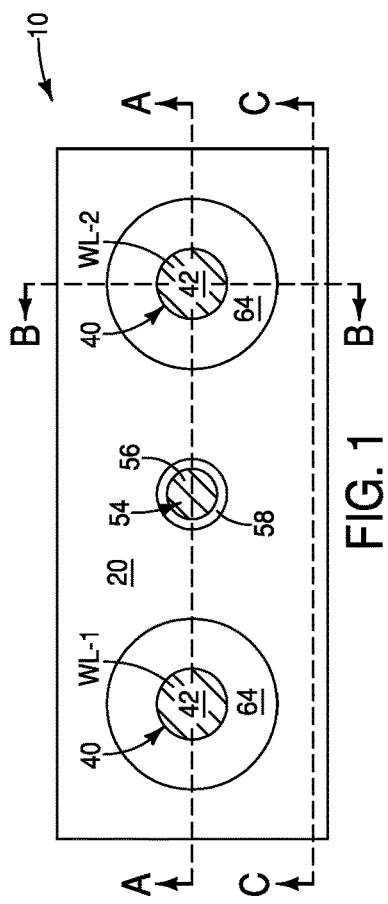
Figure 1A:
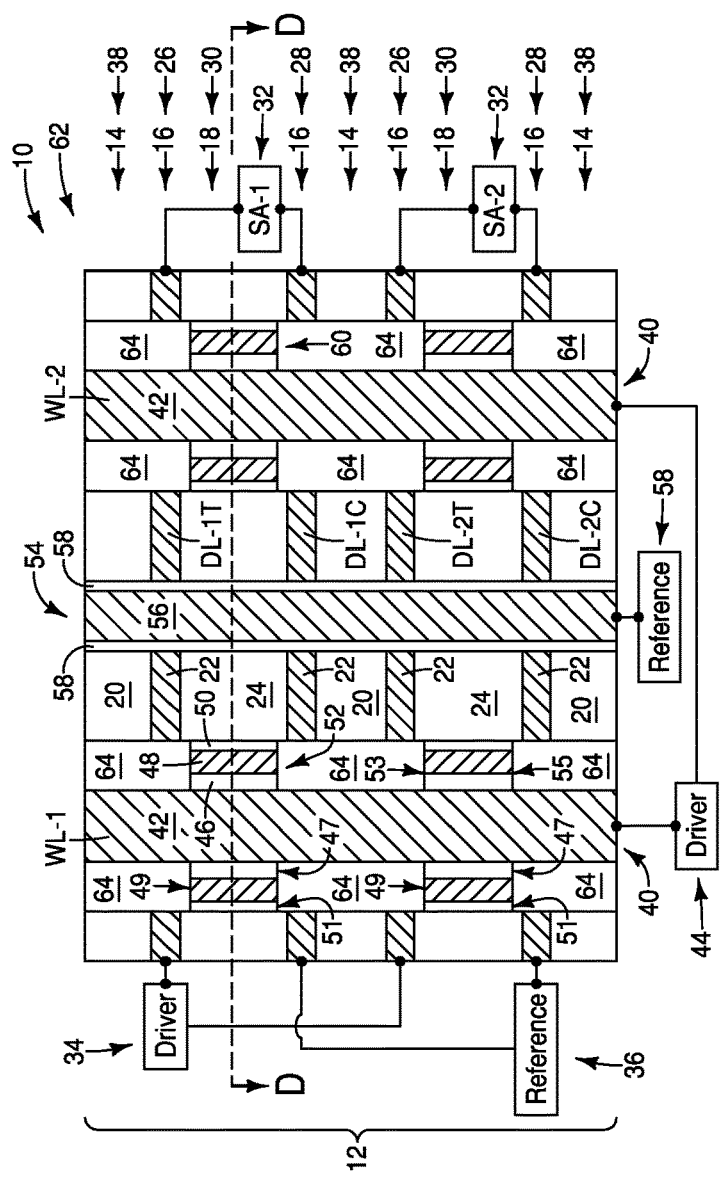
Figure 1C:
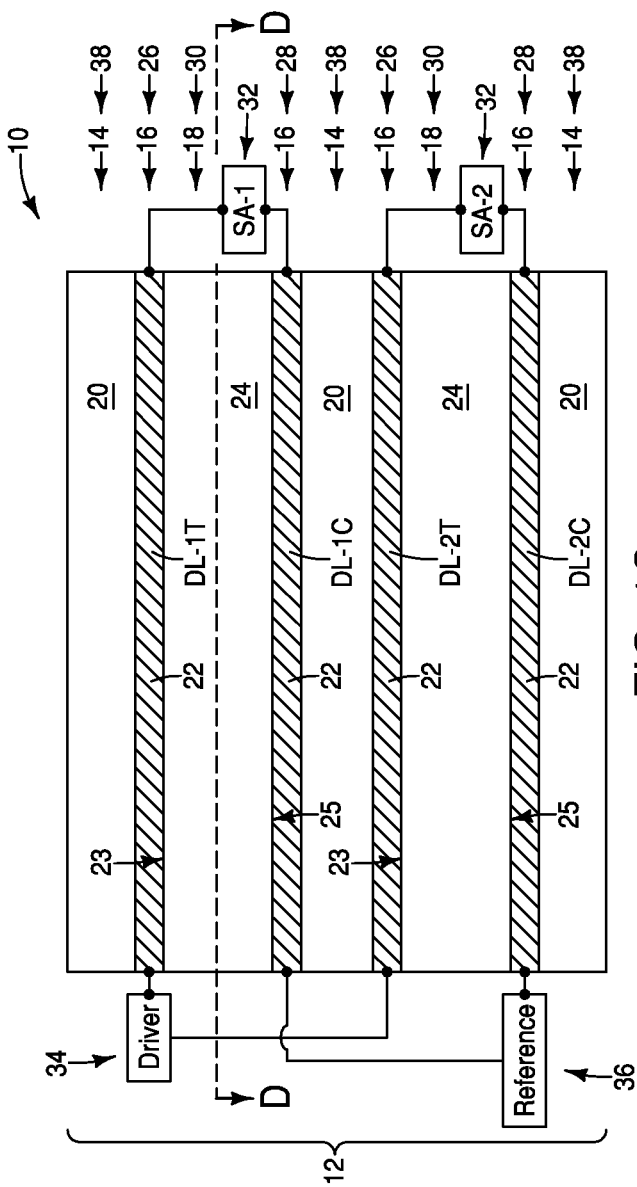
Figure 1D:
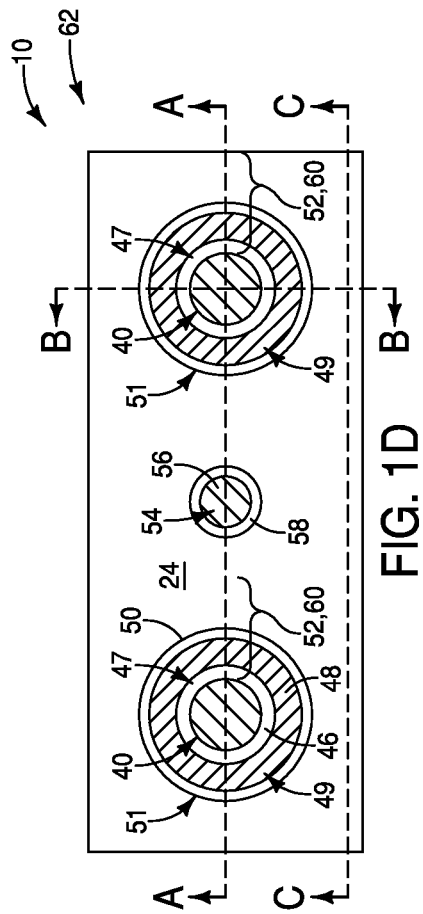

Referring to FIGS. 1-1D, an integrated assembly 10 includes a stack 12 having repeating levels 14, 16 and 18.

The levels 14 comprise insulative material 20. The insulative material 20 may comprise any suitable composition(s), and in some embodiments may comprise, consist essentially of, or consist of one or more of silicon dioxide, silicon nitride, aluminum oxide, etc.

The levels 16 comprise conductive digit line material 22. The digit line material 22 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the digit line material 22 may comprise, consist essentially of, or consist of one or more of tungsten, titanium, tungsten nitride, titanium nitride, etc.

The levels 18 comprise channel material 24. The channel material 24 may comprise any suitable composition(s), and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some embodiments, the channel material 24 may comprise, consist essentially of, or consist of appropriately-doped silicon. The silicon may be in any suitable crystalline phase (e.g., monocrystalline, polycrystalline, amorphous, etc.). In some embodiments, the silicon may be polycrystalline and may have grain sizes of at least about 1 micrometer (µm), or even of at least about 10 µm.

Dopant may be provided within the channel material 24 in any suitable profile. Regions of the channel material adjacent the digit line material 22 may be source/drain regions while regions between the source/drain regions are channel regions. The source/drain regions may be substantially more heavily doped than the channel regions. The source/drain regions may be either n-type or p-type doped. In some example embodiments, the channel material 24 may comprise silicon, and the doping within the source/drain regions may be n-type doping (e.g., doping with phosphorus, arsenic, etc.).

The channel material levels 18 may be considered to correspond to vertically-stacked channel regions 30. Each of the channel regions 30 has an upper surface 23 and a lower surface 25. In some embodiments, each of the channel regions 30 may be considered to correspond to a mass of the channel material 24. In such embodiments, the upper surface 23 of an individual mass of the semiconductor material may be considered to be along (on) one side of the mass, and the lower surface 25 may be considered to be along (on) an opposing second side of the mass.

The illustrated stack 12 comprises two of the vertically-stacked channel material levels 18. It is to be understood that the stack 12 may comprise any suitable number of the vertically-stacked channel material levels, and in some embodiments may comprise at least four of the vertically-stacked channel levels, at least eight of the vertically-stacked channel levels, at least 16 of the vertically-stacked channel levels, etc.

The digit line material 22 within the levels 16 may be considered to correspond to comparative digit lines. First comparative digit lines 26 may be considered to be along the upper surfaces 23 of the channel regions 30, and second comparative digit lines 28 may be considered to be along the lower surfaces 25 of the channel regions. The first comparative digit lines may be considered to be true digit lines, and are labeled as DL-1T and DL-2T. The second comparative digit lines may be considered to be complementary digit lines, and are labeled as DL-1C and DL-2C. The terms "true" and "complementary" are arbitrary, and are utilized simply to enable some of the digit lines to be distinguished relative to others of the digit lines.

Each of the true digit lines is paired with one of the complementary digit lines to form a paired set of the comparative digit lines, and the comparative digit lines within the paired set extend to sense-amplifier-circuitry (SA) 32. The sense-amplifier-circuitry may be referred to as a sense amplifier. In the illustrated embodiment, the comparative digit lines DL-1T and DL-1C extend to a sense amplifier SA-1, and the comparative digit lines DL-2T and DL-2C extend to a sense amplifier SA-2. The sense amplifiers may be configured to compare electrical properties of a true digit line (e.g., DL-1T) with those of a comparative digit line (e.g., DL-1C) during READ operations associated with memory cells. Alternatively, or additionally, the sense amplifiers may be utilized to impart desired electrical properties to the true and complementary comparative digit lines (e.g., DL-1T and DL-1C) during programming operations (i.e., WRITE operations) associated with the memory cells.

In the illustrated embodiment, the true digit lines (e.g., DL-1T) are coupled with driver circuitry 34 (Driver), and the complementary digit lines are coupled with a reference-voltage-source 36 (Reference). In other embodiments, the complementary digit lines may also be coupled with driver circuitry. The sense amplifiers 32 are shown to be electrically coupled to one side of the comparative digit lines 26 and 28 in the cross-sectional views of FIGS. 1A and 1C, and the driver circuitry 34 and reference-voltage-sources 36 are shown to be electrically coupled to opposing sides of the comparative digit lines 26 and 28. Such is an example configuration, and it is to be understood that other configurations may be utilized in other embodiments.

The insulative levels 14 may be considered to correspond to insulative regions 38. Such insulative regions are between vertically-neighboring first and second comparative digit lines from differing paired sets (e.g., one of the insulative levels is between the vertically-neighboring digit lines DL-1C and DL-2T), and provide electrical isolation between such vertically-neighboring digit lines.

In some embodiments, the channel levels 18 within the stack 12 may be considered to be vertically spaced from one another by intervening levels (regions) comprising the insulative regions (38) and the comparative digit lines (26 and 28).

Conductive gating structures (gate structures) 40 extend vertically through the stack 12. The term "vertically" means substantially orthogonally relative to a surface of an underlying semiconductor base (with an example semiconductor base being shown and described below relative to FIG. 5). The term "substantially orthogonally" means orthogonal to within reasonable tolerances of fabrication and measurement. In some embodiments, the vertically-extending gating structures 40 may extend along a direction which is within about 10° of orthogonal relative to a surface of an underlying base.

The conductive gating structures 40 comprise conductive material 42. The conductive material 42 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 42 may be a metal-containing material, such as, for example, one or more of tungsten, titanium, titanium nitride, tungsten nitride, etc.

The conductive gating structures 40 may have any suitable configuration. In the illustrated embodiment, the structures 40 are configured as cylindrical posts.

The gating structures 40 are shown to be along wordlines WL-1 and WL-2. Such wordlines are coupled with driver circuitry (Driver) 44. Such driver circuitry may be referred to as wordline driver circuitry in some embodiments. The wordline driver circuitry 44 may be referred to as first driver circuitry, and the driver circuitry 34 coupled with the comparative bitlines 26 may be referred to as second driver circuitry. The driver circuitries 44 and 34 may be coupled with one or more appropriate controller circuitries (not shown).

Materials 46, 48 and 50 surround the gating structures 40 along the channel levels 18. The materials 46, 48 and 50 may be considered to form rings 47, 49 and 51 around the gating structures 40, as shown in FIG. 1D. In some embodiments, the rings 47 and 51 may be referred to as first and second rings (annuluses, donut-shapes, annular rings), and the ring 49 may referred to as a third ring (annulus, donut-shape, annular ring). The rings 47, 49 and 51 may be circular-shaped (as shown), or may be elliptical-shaped, polygonal-shaped, etc., depending on the shapes of the gating structures 40. The rings 47, 49 and 51 may be referred to as concentric rings (or concentric donuts) in some embodiments.

The material 46 comprises ferroelectric material. The ferroelectric material 46 may comprise any suitable composition(s); and may, for example, comprise, consist essentially of, or consist of one or more materials selected from the group consisting of transition metal oxide, zirconium, zirconium oxide, hafnium, hafnium oxide, lead zirconium titanate, tantalum oxide, and barium strontium titanate; and having dopant therein which comprises one or more of silicon, aluminum, lanthanum, yttrium, erbium, calcium, magnesium, strontium, and a rare earth element. The ferroelectric material may be provided in any suitable configuration, such as, for example, a single homogeneous material, or a laminate of two or more discrete separate materials.

The material 48 comprises conductive material. The conductive material 48 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 48 may be a metal-containing material, and may, for example, comprise one or more of titanium, titanium nitride, tungsten, tungsten nitride, etc.

The material 50 is an insulative material, and may comprise any suitable composition(s). For instance, in some embodiments the material 50 may comprise, consist essentially of, or consist of one or more of silicon dioxide, aluminum oxide, hafnium oxide, zirconium oxide, etc.

The materials 46, 48 and 50 are together incorporated into ferroelectric transistors 52, with such ferroelectric transistors also including regions of the channel material 24, as is diagrammatically illustrated in FIG. 1D. Only one of the ferroelectric transistors 52 is labeled in FIGS. 1A, 1B and 1D to simplify the drawings. Persons of ordinary skill will understand that multiple ferroelectric transistors are formed along each of the gating structures 40. The ferroelectric transistors may be substantially identical to one another, with the term "substantially identical" meaning identical to within reasonable tolerances of fabrication and measurement. The ferroelectric transistors may be utilized as memory cells 60 within a memory array 62, as described in more detail below with reference to FIG. 3.

The ferroelectric transistors 52 of FIGS. 1A, 1B and 1D are MFMIS transistors in that they include the conductive material 48. Such conductive material may be incorporated into floating gates within the ferroelectric transistors 52. In other embodiments the conductive material 48 may be omitted, and accordingly the transistors 52 may be MFIS transistors.

In some embodiments, the rings 47, 49 and 51 may be considered to have upper surfaces 53 and lower surfaces 55, as shown in FIGS. 1A and 1B. The upper and lower surfaces 53 and 55 may be considered to correspond to first and second opposing vertical sides of the rings. The first comparative digit lines 26 (e.g., DL-2T) of the paired comparative digit lines (e.g., DL-2T/DL-2C) may be considered to be vertically outward of the first vertical sides 53 of the rings, and the second comparative digit lines 28 (e.g. DL-2C) may be considered to be vertically outward of the second vertical sides 55 of the rings.

Insulative material 64 is along the gating structures 40 and is vertically between the rings 47, 49 and 51. The insulative material 64 may comprise any suitable composition(s), and in some embodiments may comprise, consist essentially of, or consist of one or more of silicon dioxide, silicon nitride, aluminum oxide, etc. The insulative material 64 may be the same composition as the insulative material 20 or may be compositionally different than the insulative material 20.

A shield structure 54 extends through the stack 12, and is provided between the wordlines WL-1 and WL-2. The shield structure 54 comprises conductive material 56, and is laterally surrounded by an insulative material (insulative liner) 58.

The conductive material 56 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 56 may be a metal-containing material, and may, for example, comprise one or more of tungsten, titanium, tungsten nitride, titanium nitride, etc.

The insulative material 58 may comprise any suitable composition(s), and may, for example, comprise, consist essentially of, or consist of one or more of silicon dioxide, silicon nitride, aluminum oxide, etc. The insulative material 58 may be the same composition as one or both of the insulative materials 20 and 64, or may be compositionally different than one or both of the insulative materials 20 and 64.

In the illustrated embodiment, the conductive shield structure 54 is configured as a cylindrical post. In other embodiments, the conductive shield structure may have another suitable configuration.

The conductive shield structure 54 is shown to be coupled with a reference-voltage-source 58 (Reference). The reference-voltage-source 58 may be the same as the reference-voltage-source 36, or may be different than the reference-voltage-source 36. The reference-voltage-source 58 may be at any suitable voltage, including, for example, ground, VCC/2, etc.

Figure 2:
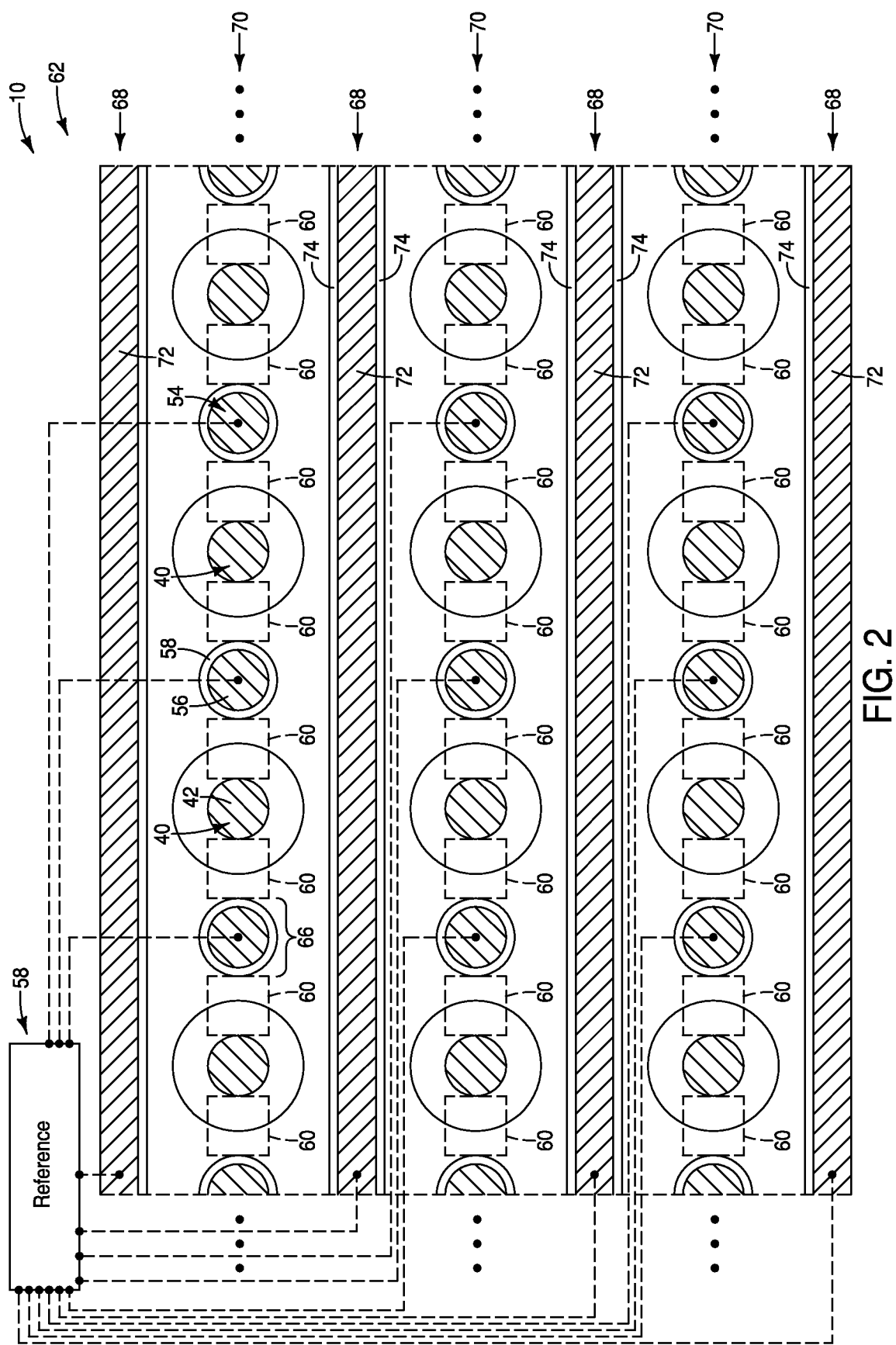
FIG. 2 is a diagrammatic top-down view of a region of an example integrated assembly.

The memory cells 60 may be arranged in horizontally-extending rows 70, as is diagrammatically illustrated in FIG. 2. The view of FIG. 2 is a top-down view similar to the view of FIG. 1, and accordingly the memory cells 60 are not visible in such view. However, approximate locations of the memory cells are diagrammatically illustrated with dashed-line-boxes 60.

The memory cells 60 within a common row 70 are horizontally spaced from one another by intervening regions 66 (only one of which is labeled). The shield structures 54 extend through the stack 12 (FIGS. 1A-C) in the intervening regions 66.

Conductive shield structures 68 extend through the stack 12 (FIGS. 1A-C) and separate neighboring rows 70 from one another. In some embodiments, the shield structures 68 may be referred to as first conductive shield structures, and the shield structures 54 may be referred to as second conductive shield structures. The shield structures 68 are configured as panels in the embodiment of FIG. 2.

The shield structures 68 comprise conductive material 72. The conductive material 72 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). The conductive material 72 of the shield structures 68 may be the same composition as the conductive material 56 of the shield structures 54 or may be compositionally different than the conductive material 56.

Insulative material 74 is along the conductive material 72 of the shield structures 68, and lines such conductive material. The insulative material 74 may comprise any suitable composition(s), and in some embodiments may comprise, consist essentially of, or consist of one or more of silicon dioxide, silicon nitride, aluminum oxide, etc.

FIG. 2 shows the shield structures 68 and 54 coupled with the reference-voltage-source 58. In other embodiments, the shield structures 68 may be coupled with a different reference-voltage-source than the shield structures 54.

Figure 3:
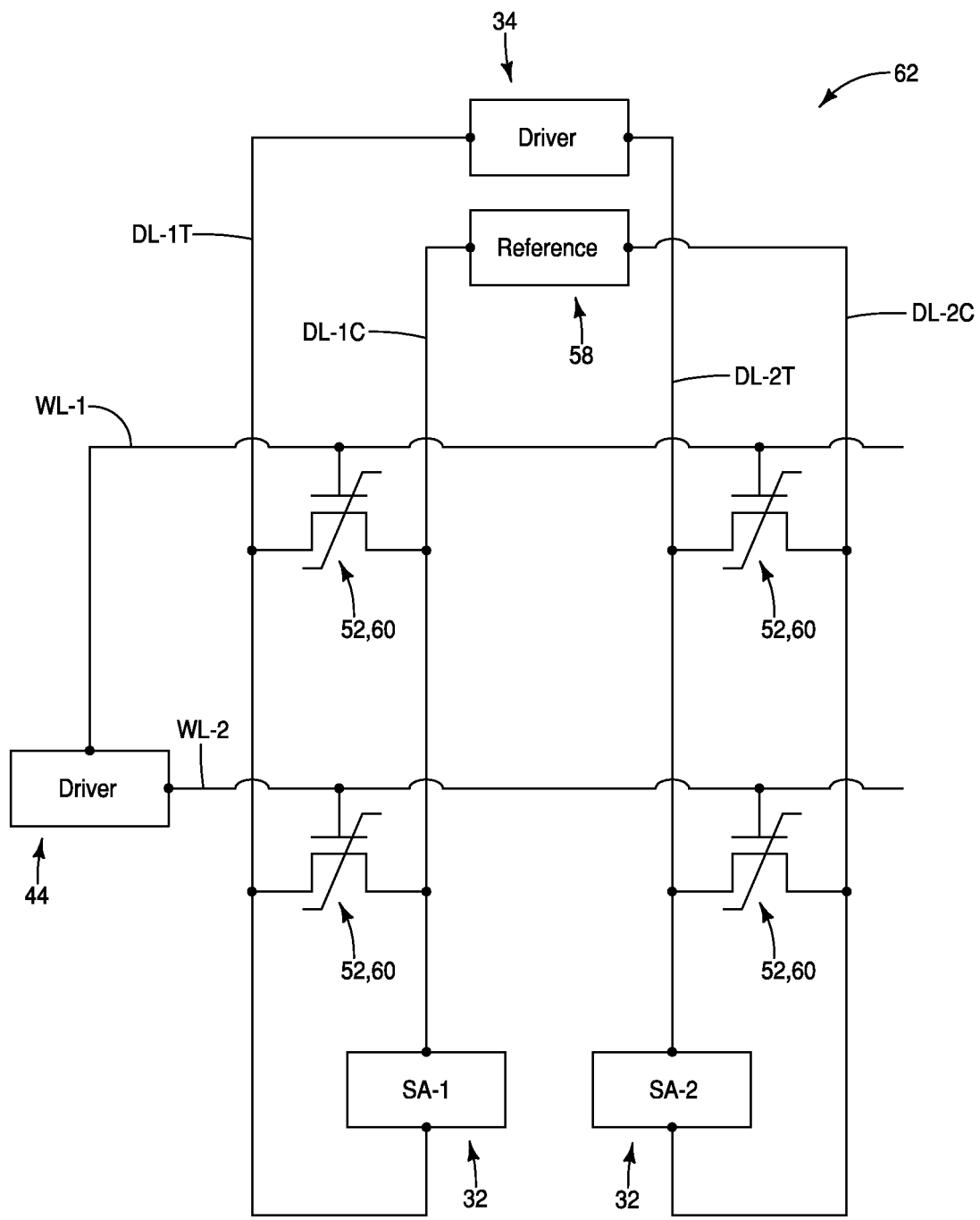
FIG. 3 is a schematic view of regions of an example memory array.

The memory arrays 62 may have any suitable configuration. FIG. 3 schematically illustrates an example configuration of the memory array 62 of FIGS. 1 and 2.

The example memory array 62 includes a plurality of the memory cells 60 Each of the memory cells 60 comprises one of the ferroelectric transistors 52. Wordlines WL-1 and WL-2 are coupled with the driver 44 (i.e., wordline driver, driver circuitry, row driver circuitry, etc.), and extend along rows of the memory array. Digit line pairs DL-1T/DL-1C and DL-2T/DL-2C extend along columns of the memory array. The true (i.e., first) comparative digit lines DL-1T and DL-2T are coupled with the digit line driver 34 (i.e., digit line driver circuitry, column driver circuitry, etc.), and the complementary (i.e., second) comparative digit lines DL-1C and DL-2C are coupled with the reference-voltage-source 58. The reference-voltage-source may be at any suitable voltage, such as, for example, ground, VCC/2, etc.

Each of the memory cells 60 is uniquely addressed through a combination of one of the wordlines and one of the sets of first and second comparative digit lines.

The true and complementary comparative digit lines (e.g., DL-1T and DL-1C) of each of the paired digit line sets (e.g., DL-1T/DL-1C) are electrically coupled with the sense amplifiers 32. The sense amplifiers 32 may be configured to compare electrical properties of a true digit line (e.g., DL-1T) with those of a comparative digit line (e.g., DL-1C) during a READ operation. Alternatively, or additionally, the sense amplifiers may be utilized to impart desired electrical properties to the true and complementary comparative digit lines (e.g., DL-1T and DL-1C) during a programming (i.e., WRITE) operation.

In some embodiments, the reference-voltage-source 58 of FIG. 3 may be replaced with another driver.

Figure 4:
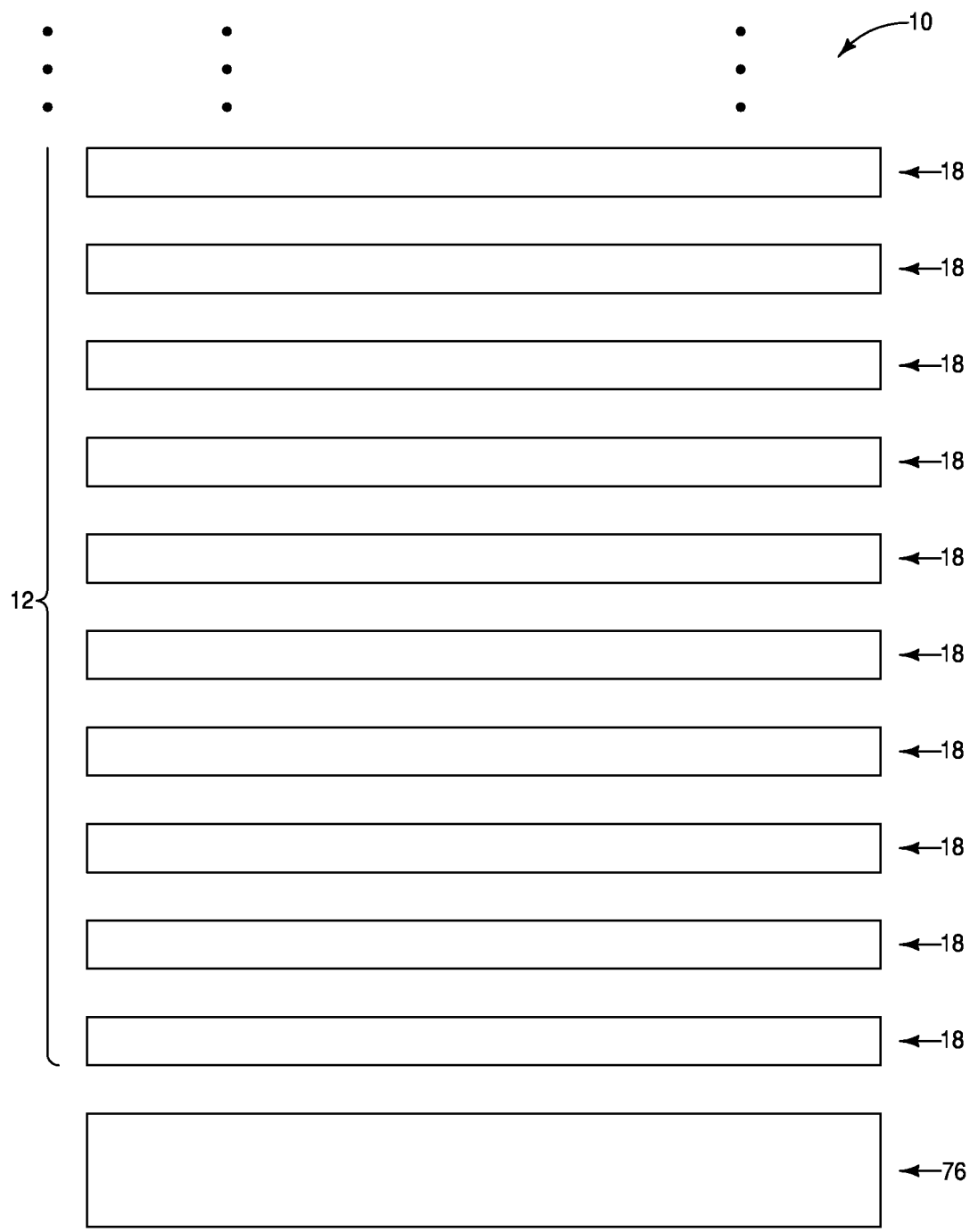
FIG. 4 is a diagrammatic cross-sectional side view of a region of an example integrated assembly comprising multiple tiers of memory structures.

In some embodiments, each of the channel levels 18 within the stack 12 of FIGS. 1-1D may be considered to be a memory level, in that the memory cells 60 are along such levels. FIG. 4 diagrammatically shows that the stack 12 may be supported by a semiconductor base 76, and that the stack 12 may comprise a large number of the memory levels 18. In some embodiments, the stack 12 may comprise 4 of the memory levels, 8 of the memory levels, 16 of the memory levels, 32 of the memory levels, 64 the memory levels, etc.

The base 76 may comprise semiconductor material; and may, for example, comprise, consist essentially of, or consist of monocrystalline silicon. The base 76 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 76 may correspond to a semiconductor substrate containing one or more materials associated with integrated circuit fabrication. Such materials may include, for example, one or more of refractory metal materials, barrier materials, diffusion materials, insulator materials, etc.

The assemblies described herein may be formed with any suitable methods. An example fabrication process for forming an example assembly is described with reference to FIGS. 5-14.

Figure 5:
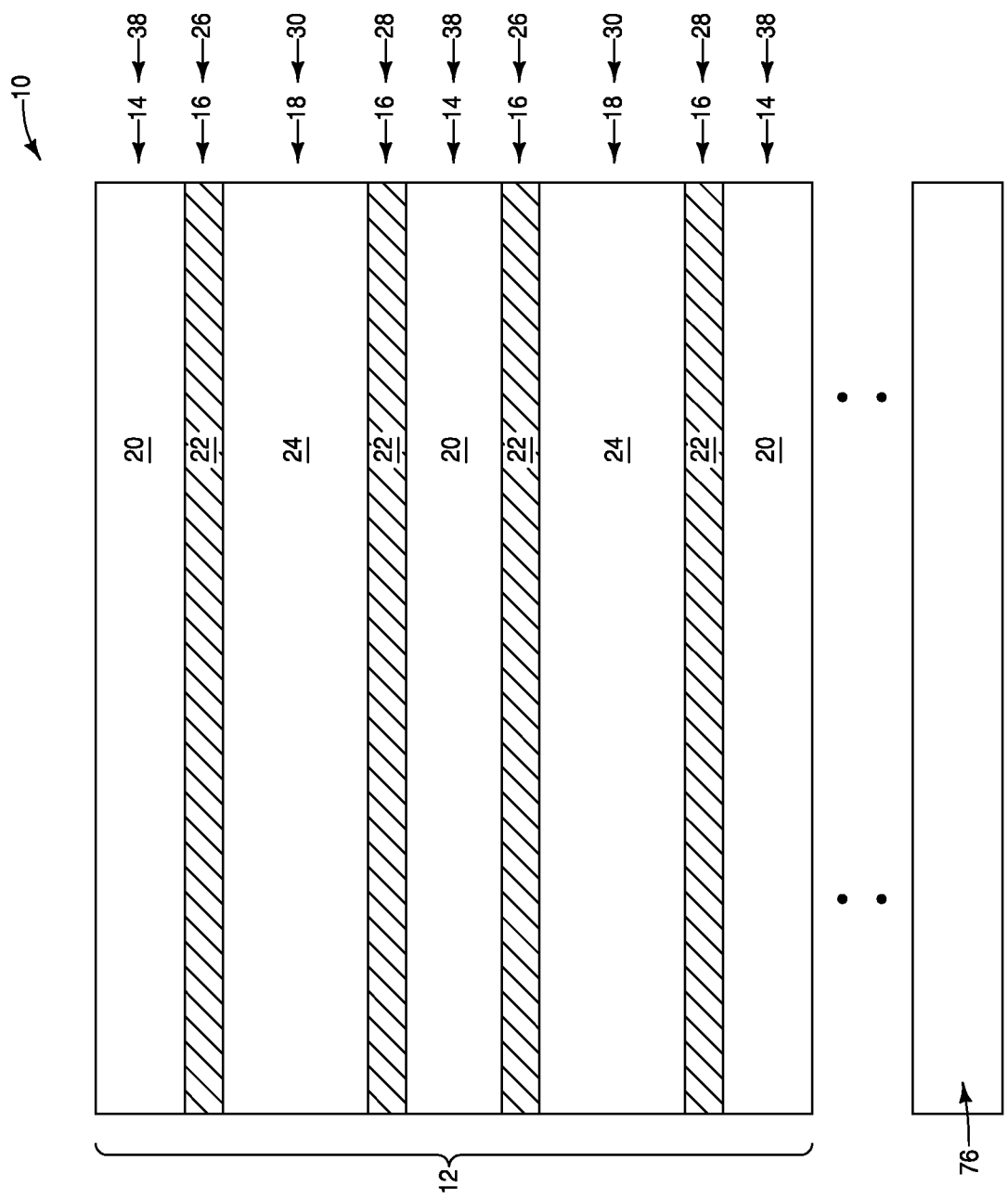
FIGS. 5-14 are diagrammatic cross-sectional side views of a region of an example assembly at example sequential process stages of an example method.

Referring to FIG. 5, the stack 12 is formed over the base 76. A gap is between the base and the stack in the illustration of FIG. 5 to diagrammatically indicate that additional materials and/or structures may be provided between the base and the stack in some embodiments.

The stack 12 comprises the insulative levels 14, the digit line of levels 16 and the channel levels 18 described above. The digit line levels comprise the conductive material 22 and are subdivided into the first digit line levels 26 and the second digit line levels 28. The channel levels 18 correspond to the channel regions 30, and comprise the channel material 24. The insulative levels 14 correspond to the insulative regions 38, and comprise the insulative material 20.

In some embodiments, the stack 12 may be annealed at a temperature of at least about 1000° C. for a duration of at least about one second to form (induce) an average crystalline grain size within the silicon of at least about 1 micron (μm). In some embodiments, the annealing may induce an average crystalline grain size within the silicon of at least about 10 μm.

It can be advantageous to conduct the annealing at the process stage of FIG. 5 as such is prior to formation of materials (e.g., ferroelectric materials) that may be otherwise detrimentally affected by the high-temperature annealing.

Figure 6:
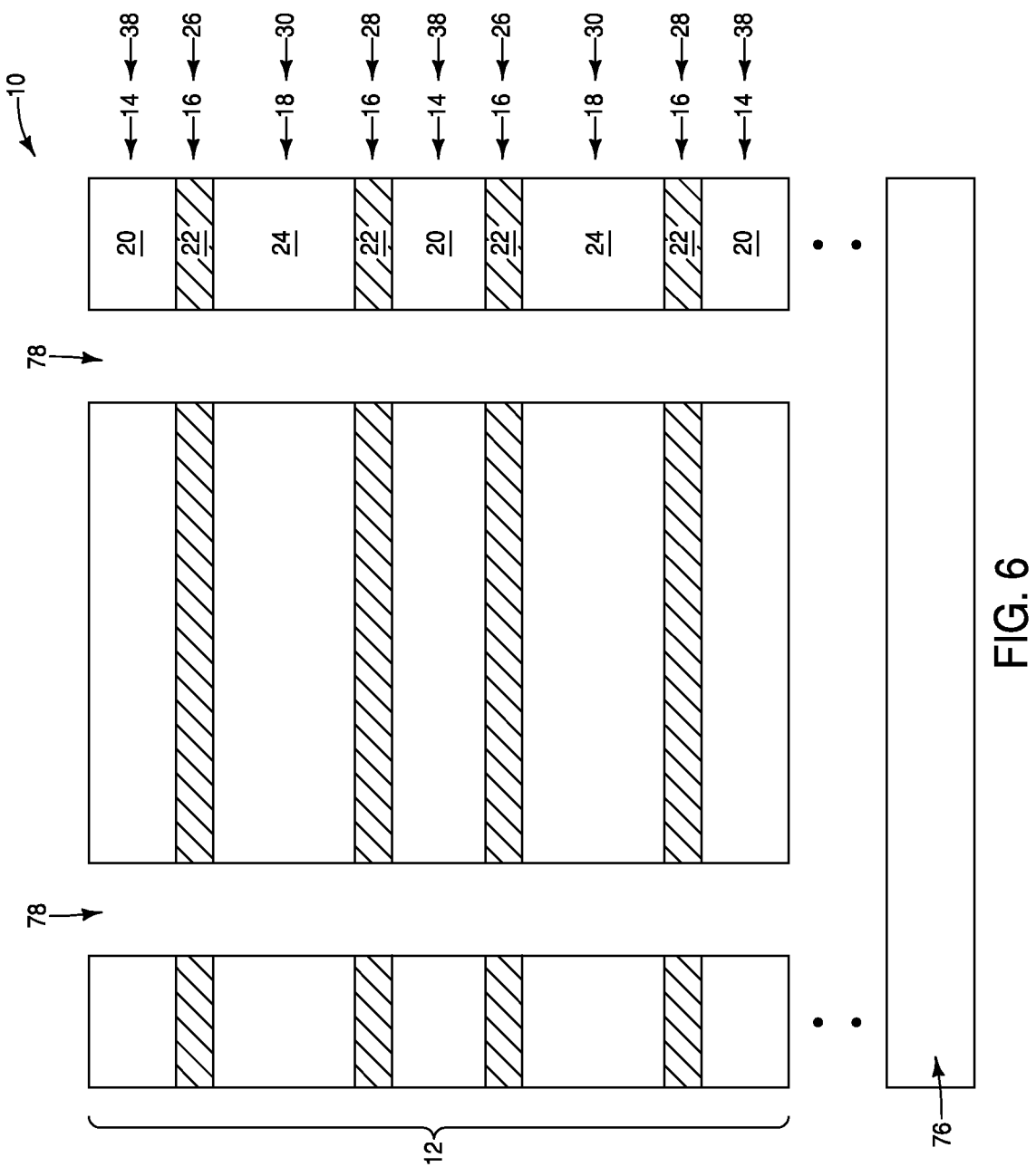

Referring to FIG. 6, openings 78 are formed to extend through the stack 12.

Figure 7:
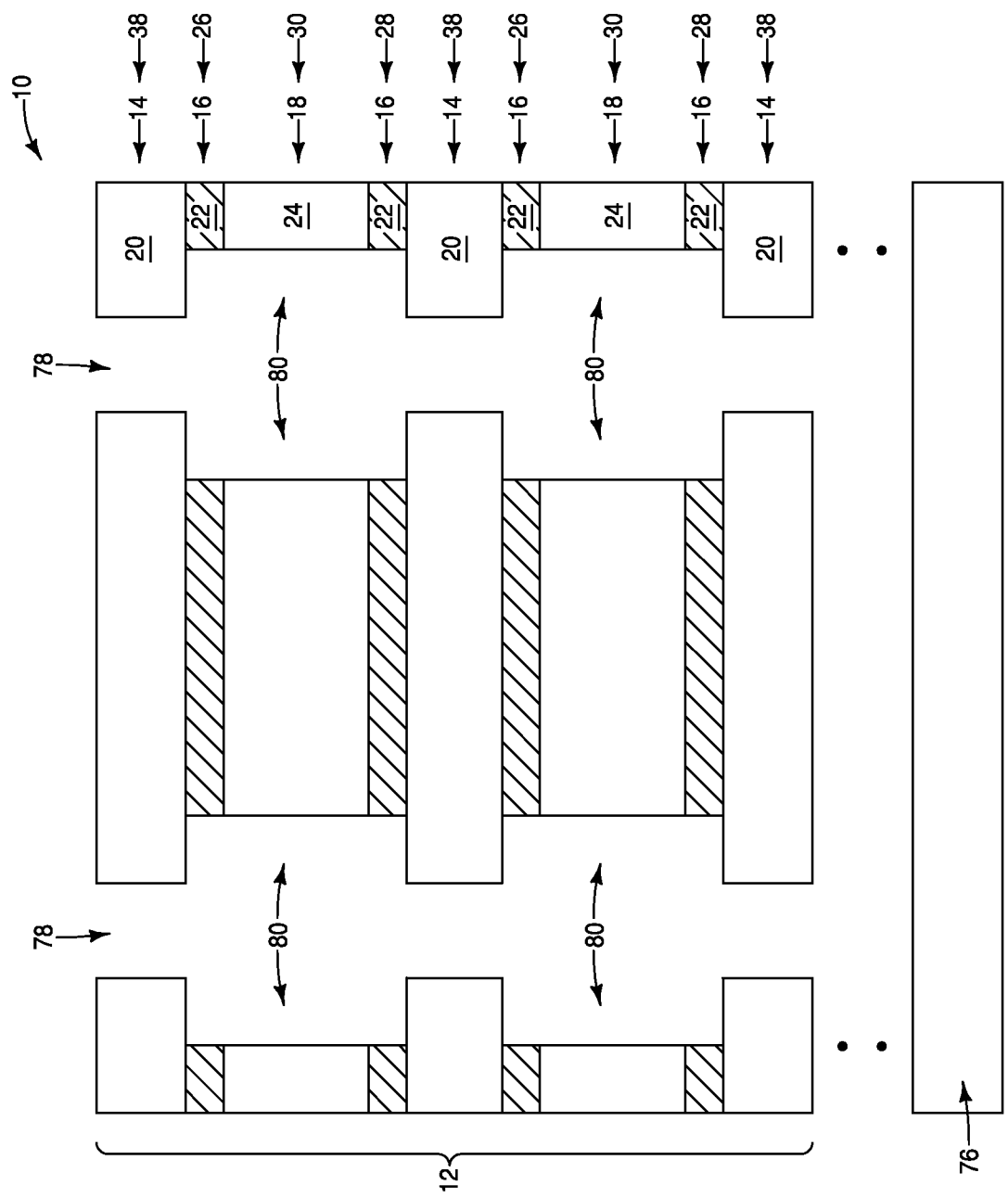

Referring to FIG. 7, the channel material 24 and the digit line material 22 are recessed relative to the insulative material 20 to form cavities 80 extending into the digit line levels 16 and the channel levels 18. The recesses 80 may be formed with one or more suitable etches selected for one or both of the materials 24 and 22 relative to the material 20. For purposes of interpreting this disclosure and the claims that follow, an etch is considered to be selective for a first material relative to a second material if the etch removes the first material faster than the second material, which may include, but which is not limited to, etches which are 100% selective for the first material relative to the second material.

Although the materials 22 and 24 are both shown to be recessed to the same amount during the formation of the cavities 80, it is to be understood that in other embodiments the materials 22 and 24 may be recessed to different amounts. Further, in some embodiments it may be only the channel material 24 which is recessed to form the cavities 80 rather than also including the digit line material 22.

Figure 8:
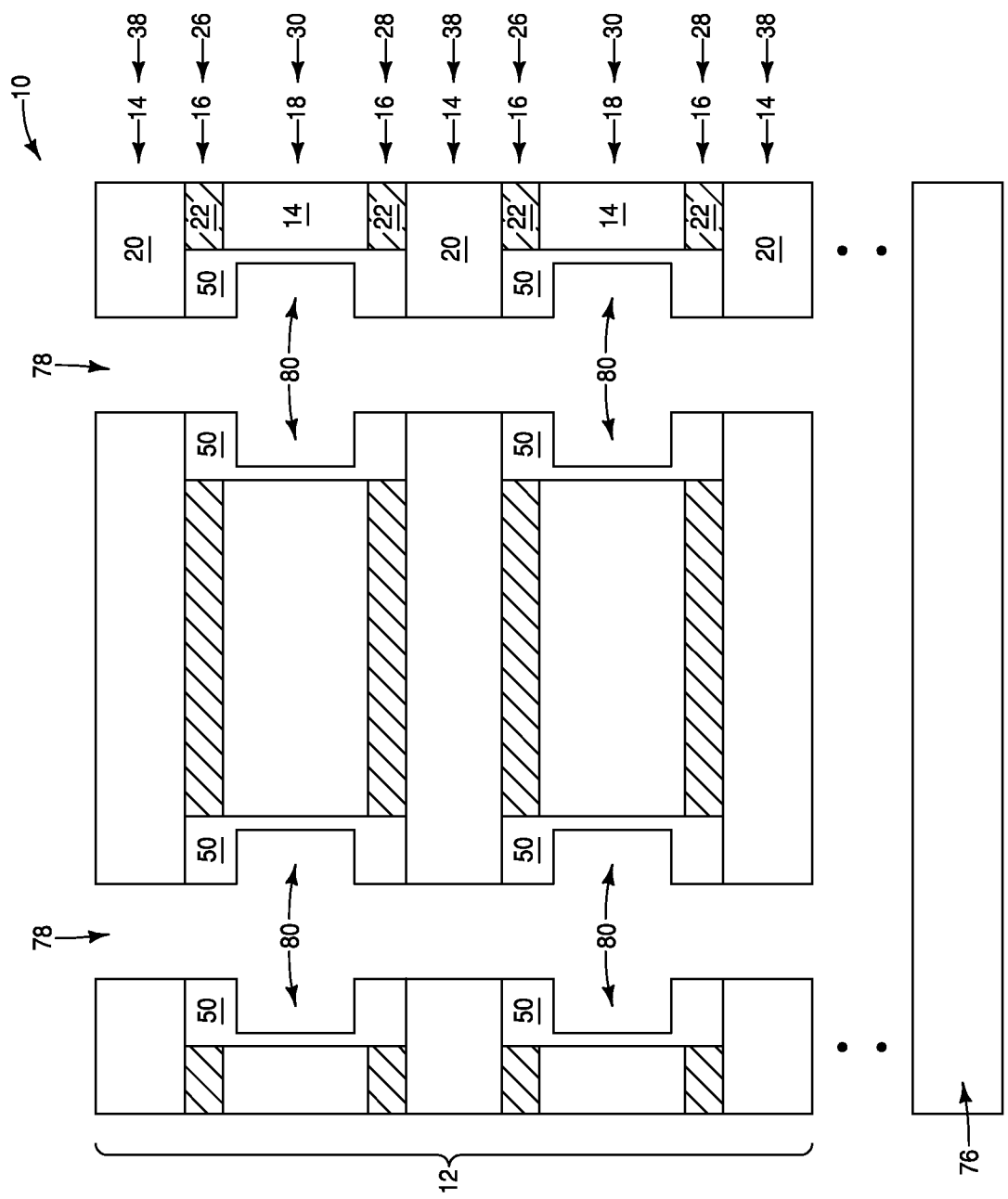

Referring to FIG. 8, the cavities 80 are lined with the insulative material 50. Such narrows the cavities 80.

Figure 9:
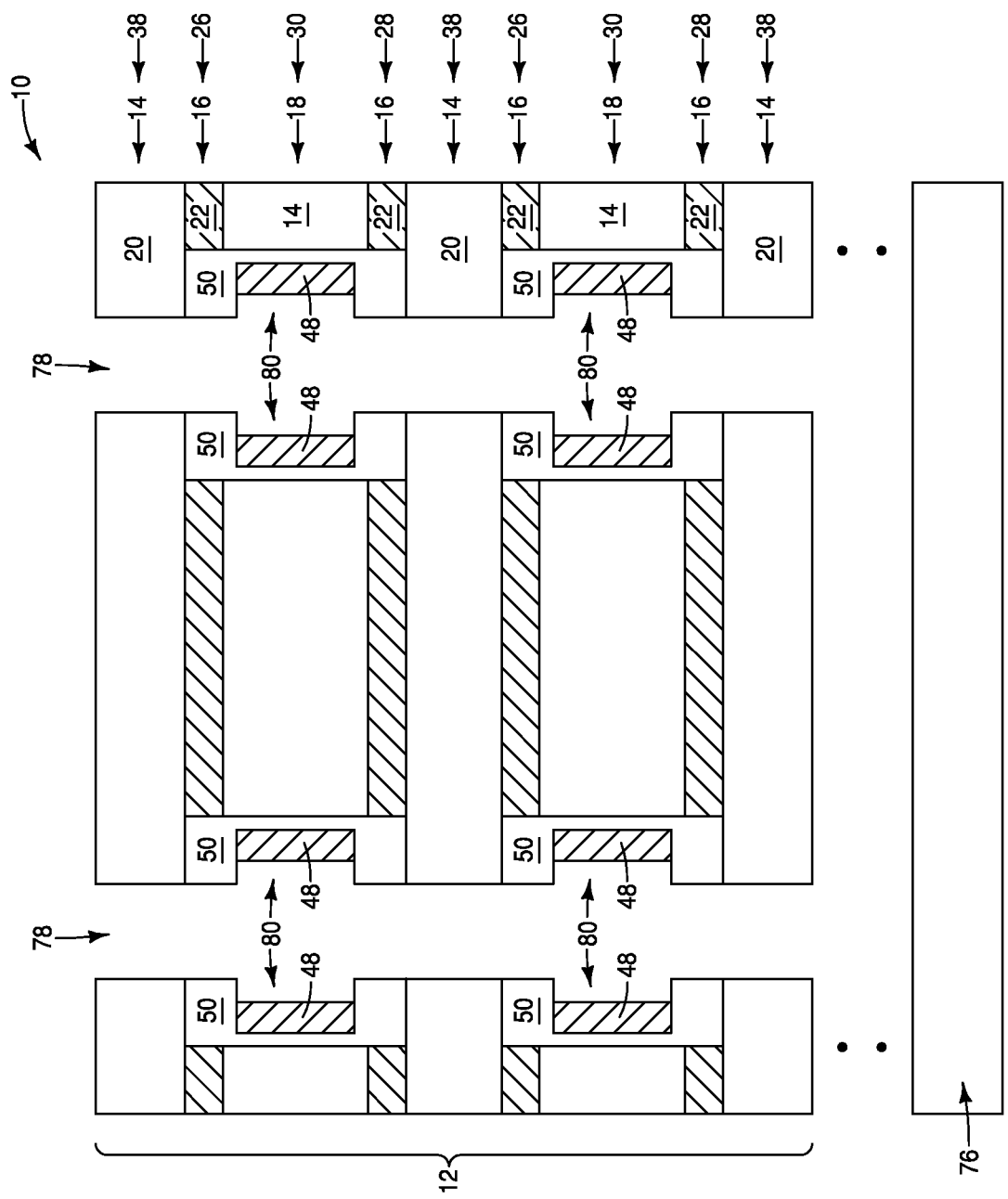

Referring to FIG. 9, the conductive material 48 is formed within the narrowed cavities 80. In some embodiments, the formation of the conductive material 48 may be omitted in order to form MFIS devices rather than MFMIS devices.

Figure 10:
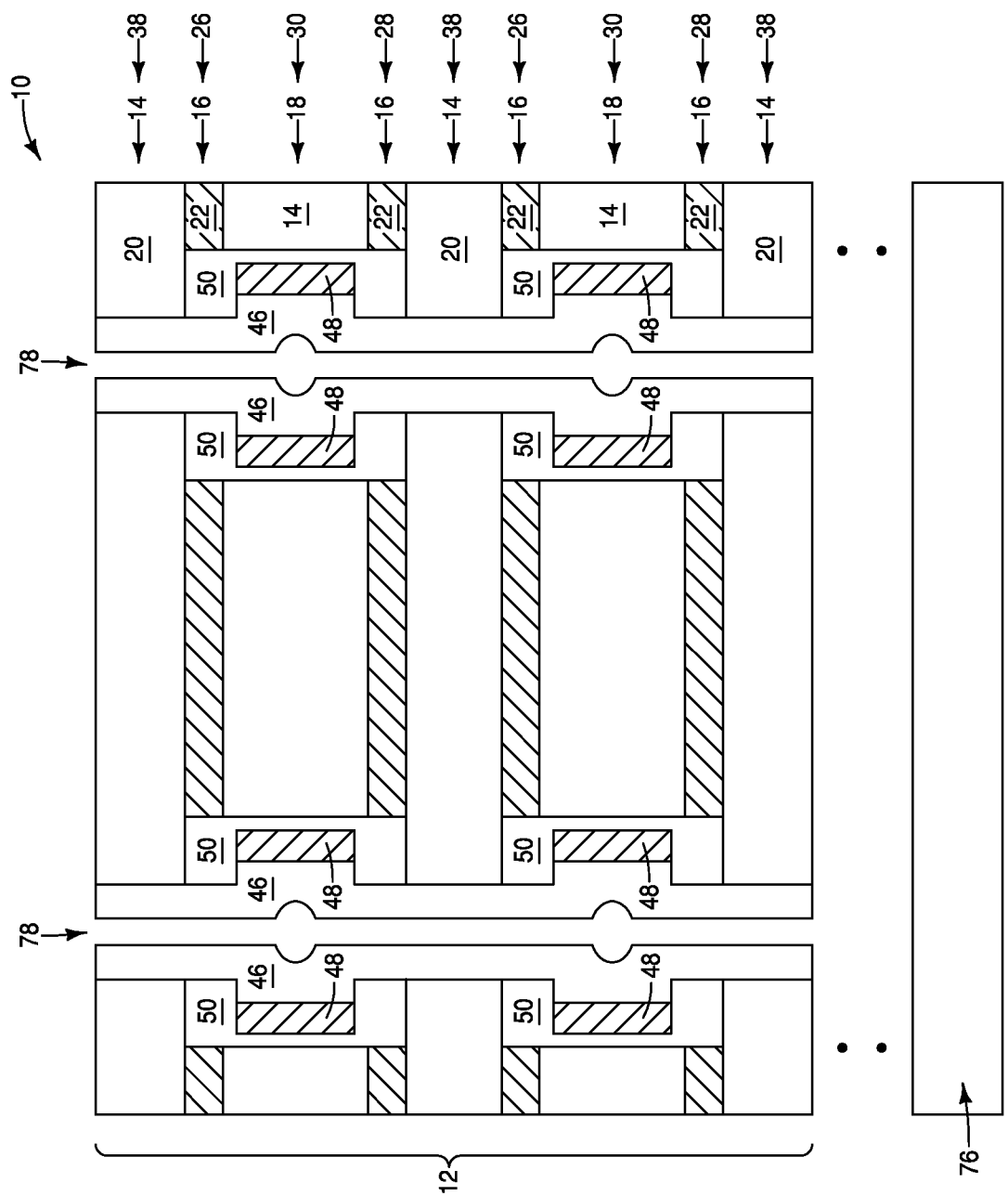

Referring to FIG. 10, the ferroelectric material 46 is formed within the narrowed cavities 80 (FIG. 9).

Figure 11:
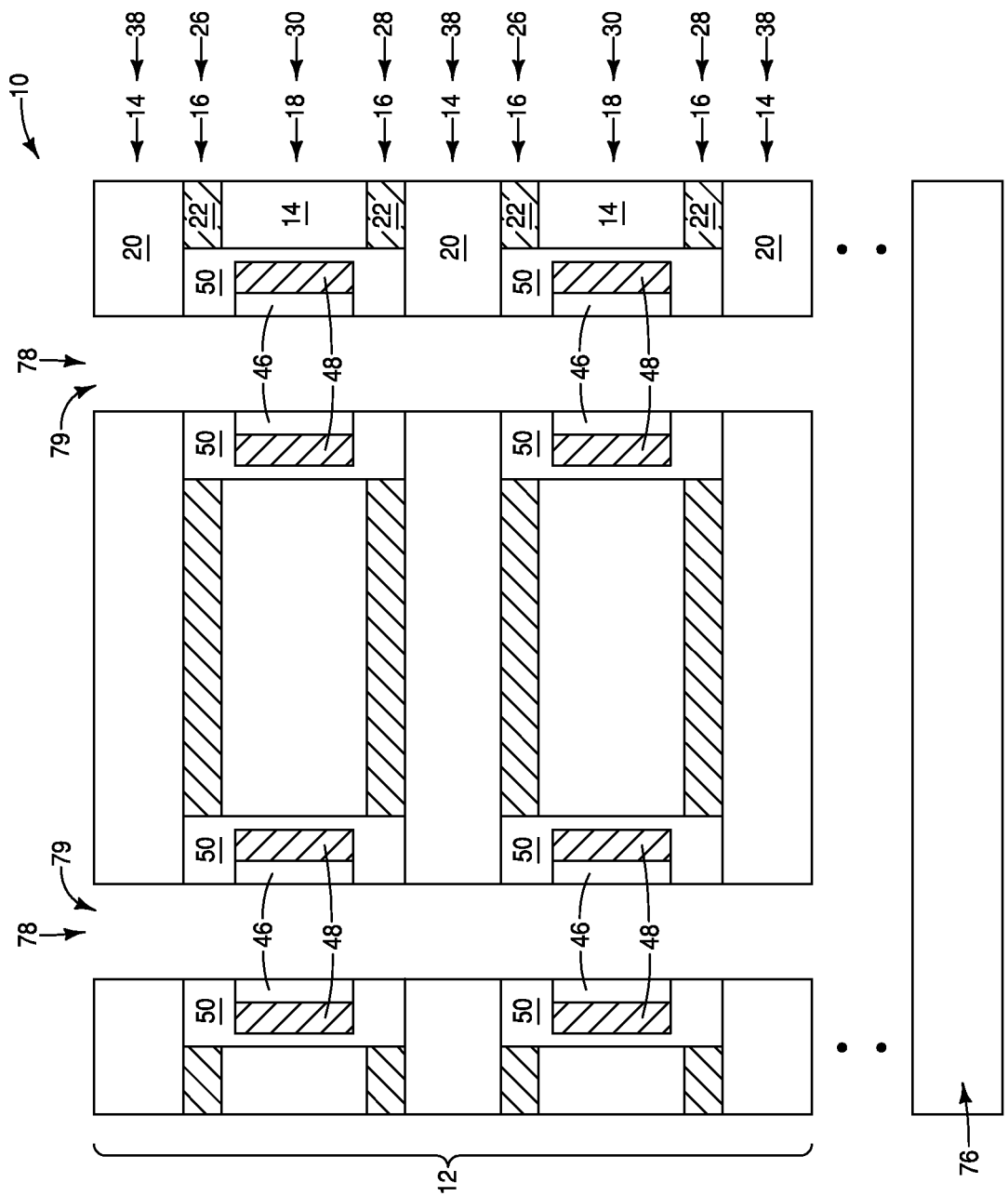

Referring to FIG. 11, the openings 78 are reestablished with one or more etches.

Figure 12:
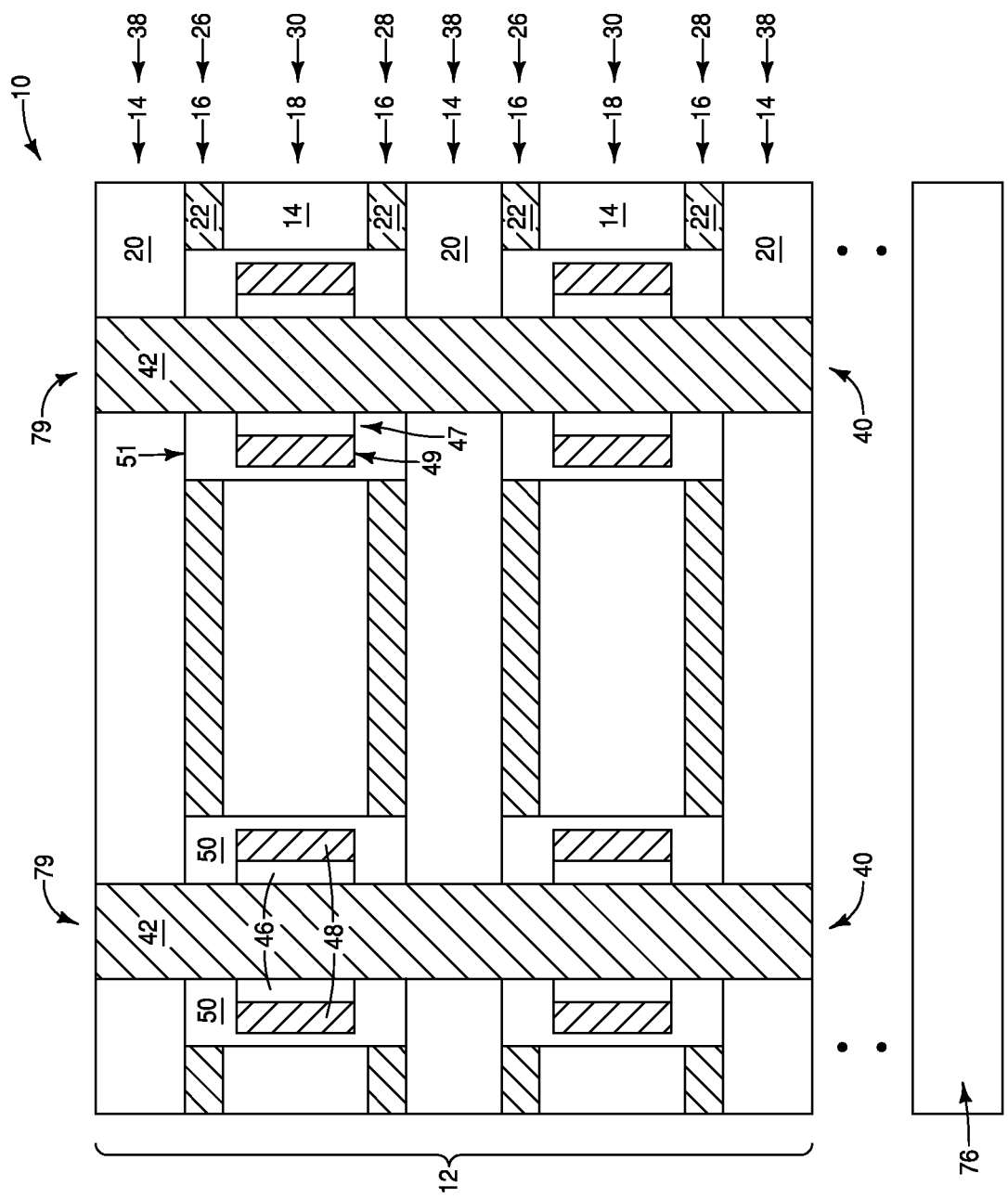

Referring to FIG. 12, conductive material 42 is formed within the openings 78 (FIG. 11) to form the gating structures 40. The materials 46, 48 and 50 adjacent to the gating structures are rings analogous to the rings 47, 49 and 51 described above with reference to FIGS. 1-1D.

Figure 13:
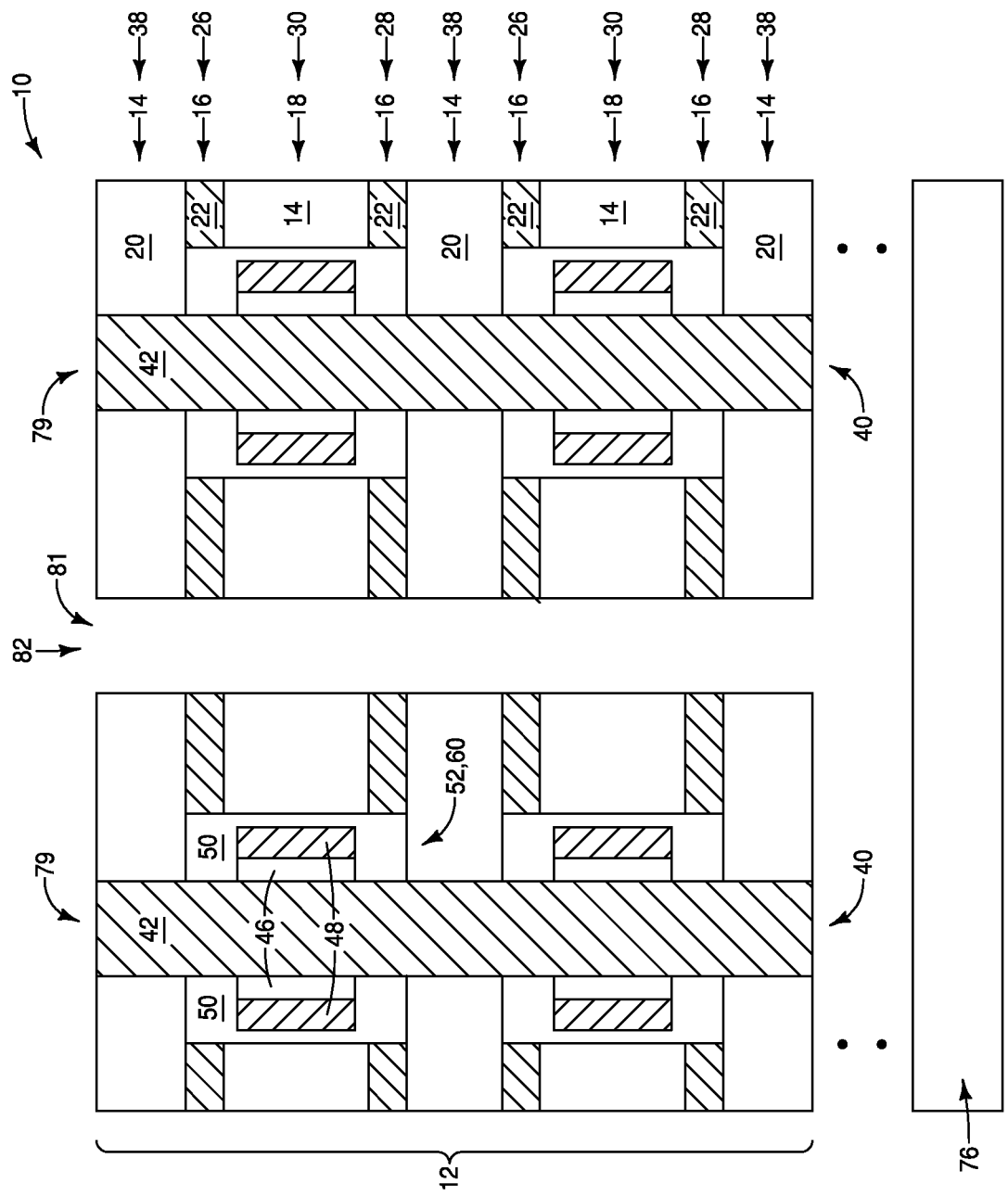

In some embodiments, the openings 78 of FIG. 11 may be referred to as first openings formed within first locations 79. FIG. 13 shows a second opening 82 formed within a second location 81 between the locations 79. The second opening 82 extends through the stack 12.

Figure 14:
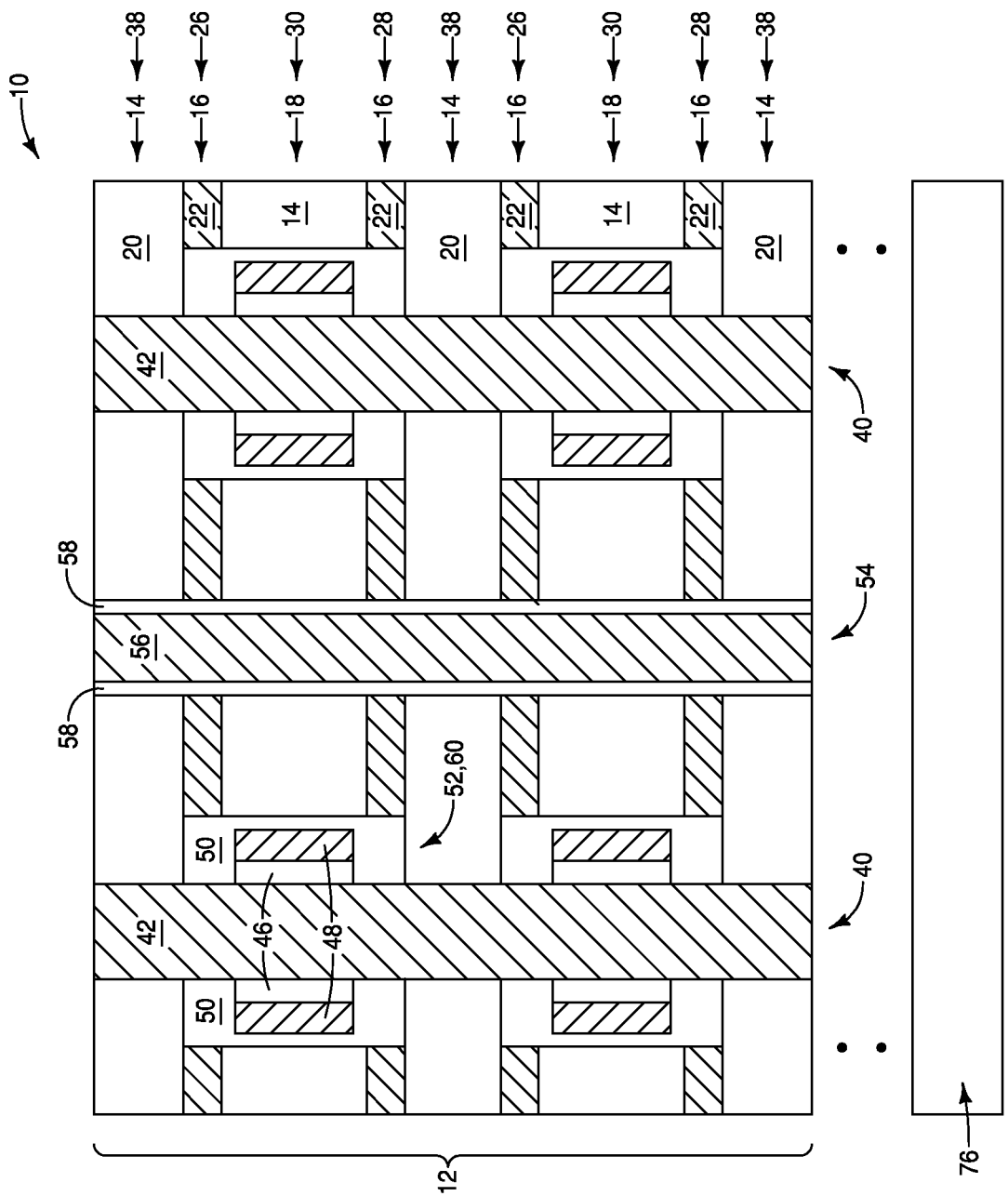

Referring to FIG. 14, the opening 82 (FIG. 13) is lined with the insulative liner material 58, and is then filled with the conductive shield material 56 to form the shield structure 54. In some embodiments, the conductive material 42 of the gating structures 40 may be referred to as first conductive material, and the conductive material 56 of the shield structure 54 may be referred to as second conductive material. The first and second conductive materials 42 and 56 may comprise a same composition as one another, or may comprise different compositions relative to one another.

In some embodiments, the shield panels 68 of FIG. 2 may be fabricated simultaneously with the shield structure 54.

The embodiment of FIGS. 11-14 shows the gating material 42 formed within the openings 78 prior to forming the shield material 56 within the opening 82. In other embodiments, the gating material 42 and the shield material 56 may be formed simultaneously within the openings 78 and 82.

Figure 15:
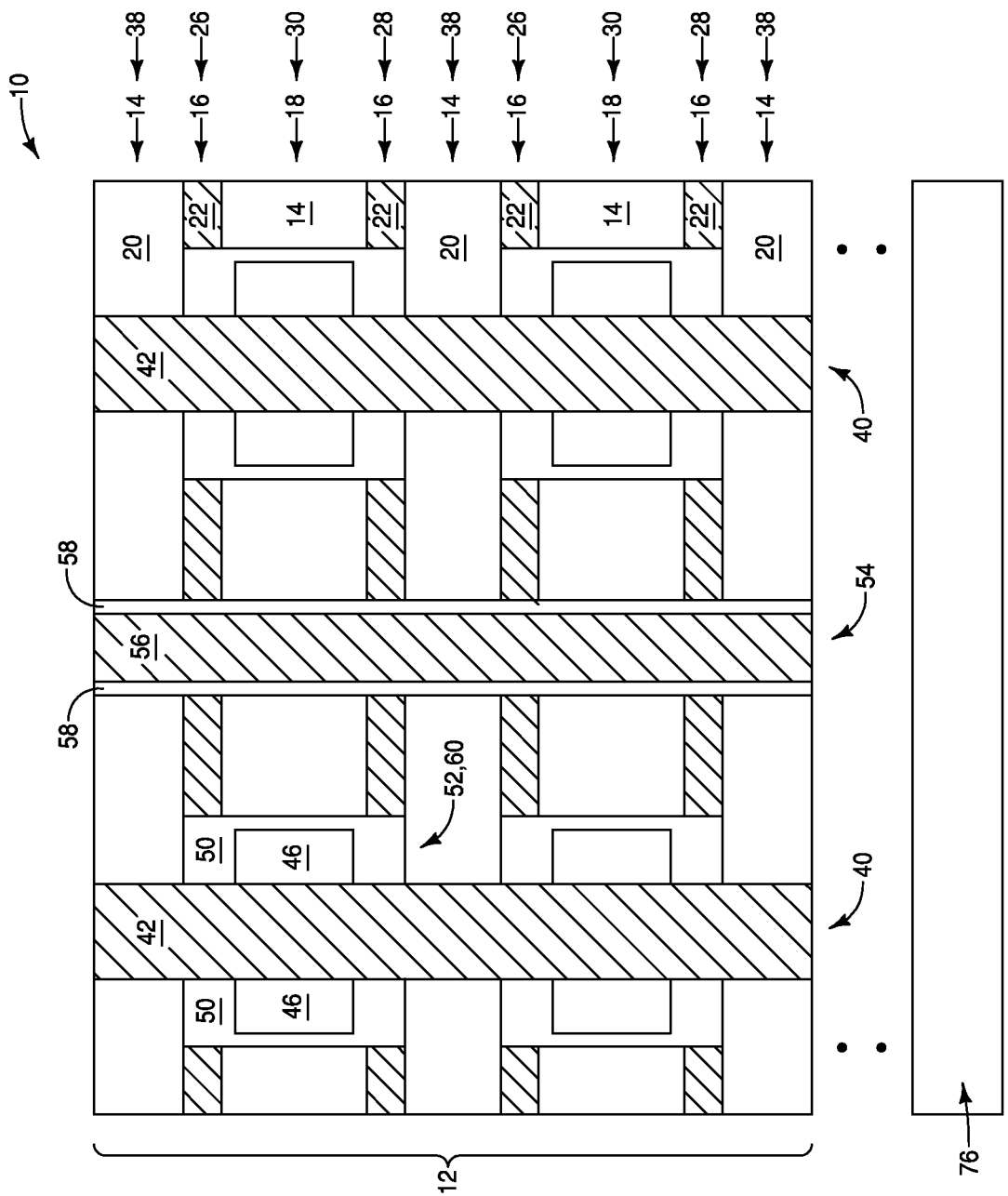
FIG. 15 is a diagrammatic cross-sectional side view of a region of an example integrated assembly.

As discussed above, in some embodiments the conductive material 48 (i.e., the material of the floating gates provided within the MFMIS structures) may be omitted so that MFIS structures are fabricated instead of MFMIS structures. FIG. 15 shows an example configuration of the assembly 10 analogous to that of FIG. 14, but in which the metal 48 is omitted so that the ferroelectric transistors 52 (and the associated memory cells 60) correspond to MFIS structures.

The ferroelectric transistors described herein may be incorporated into memory cells as described in the example embodiments presented herein, or may be utilized in any other suitable applications, including, for example, sensors, logic, processors, etc.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a ferroelectric transistor having a conductive gate structure, a first ring extending around the conductive gate structure and a second ring extending around the first ring. The first ring includes ferroelectric material. The second ring includes insulative material. A mass of channel material is outward of the second ring.

Some embodiments include an integrated assembly comprising vertically-stacked channel regions. Each of the channel regions has an upper surface and a lower surface. First comparative digit lines are along the upper surfaces of the channel regions and second comparative digit lines are along the lower surfaces of the channel regions. Insulative regions are between vertically-neighboring of the first and second comparative digit lines. The channel regions, first comparative digit lines, second comparative digit lines and insulative regions are together configured as a stack. The channel regions are along channel levels of the stack, with said channel levels being vertically spaced from one another by intervening levels comprising the first and second comparative digit lines and the insulative regions. Conductive gating structures extend vertically through the stack. First rings extend around the conductive gating structures along the channel levels. The first rings comprise ferroelectric material. Second rings extend around the first rings and comprise insulative material.

Some embodiments include a method of forming an integrated assembly. A stack is formed to include insulative levels, digit line levels and channel levels. The digit line levels include first digit line levels and second digit line levels. The first and second digit line levels are in paired sets, with each paired set having one of the first digit line levels and one of the second digit line levels. The channel levels are between the first and second digit line levels of the paired sets. The insulative levels are between the first and second digit line levels of vertically-neighboring paired sets. Openings are formed to extend through the stack. The digit line and channel levels are recessed selectively relative to the insulative levels to form cavities extending into the digit line levels and the channel levels. The cavities are lined with insulative material to narrow the cavities. Ferroelectric material is formed within the narrowed cavities. After the ferroelectric material is formed, the openings are filled with conductive material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A ferroelectric transistor, comprising:
   a conductive gate structure;
   a first ring extending around the conductive gate structure and comprising ferroelectric material;
   a second ring extending around the first ring and comprising insulative material;
   a third ring between the first and second rings, the third ring comprising conductive material; and
   a mass of channel material outward of the second ring.

2. The ferroelectric transistor of claim 1 wherein the conductive gate structure is coupled with driver circuitry.

3. The ferroelectric transistor of claim 2 within an assembly which comprises:
   a first comparative digit line on a first side of the mass of channel material and outward of a first side of the first ring;
   a second comparative digit line on a second side of the mass of channel material and outward of a second side of the first ring, with the second side of the mass of channel material being in opposing relation to the first side, and with the second side of the first ring being in opposing relation to the first side of the first ring; and
   a sense amplifier coupled with the first and second comparative digit lines.

4. The ferroelectric transistor of claim 3 wherein the driver circuitry is first driver circuitry, and further comprising second driver circuitry coupled with the first comparative digit line.

5. The ferroelectric transistor of claim 1 wherein the conductive gate structure extends vertically relative to a surface of an underlying semiconductor base.

6. The ferroelectric transistor of claim 5 being one of many substantially identical ferroelectric transistors vertically stacked along the conductive gate structure.

7. The ferroelectric transistor of claim 1 wherein the channel material comprises silicon.

8. The ferroelectric transistor of claim 7 wherein the silicon has an average crystalline grain size of at least about 1 micron.

9. The ferroelectric transistor of claim 8 wherein the average crystalline grain size is at least about 10 microns.

10. The ferroelectric transistor of claim 1 wherein the insulative material comprises silicon dioxide.

11. The ferroelectric transistor of claim 1 wherein the ferroelectric material comprises one or more of transition metal oxide, zirconium, zirconium oxide, hafnium, hafnium oxide, lead zirconium titanate, tantalum oxide, and barium strontium titanate.

12. The ferroelectric transistor of claim 11 wherein the ferroelectric material further comprises dopant, with the dopant comprising one or more of silicon, aluminum, lanthanum, yttrium, erbium, calcium, magnesium, strontium, and a rare earth element.

13. An integrated assembly, comprising:
   vertically-stacked channel regions; each of the channel regions having an upper surface and a lower surface;
   first comparative digit lines along the upper surfaces of the channel regions and second comparative digit lines along the lower surfaces of the channel regions;
   insulative regions between vertically-neighboring of the first and second comparative digit lines; the channel regions, first comparative digit lines, second comparative digit lines and insulative regions together being configured as a stack; the channel regions being along channel levels of the stack, with said channel levels being vertically spaced from one another by intervening levels comprising the first and second comparative digit lines and the insulative regions;
   conductive gating structures extending vertically through the stack;
   first rings extending around the conductive gating structures along the channel levels, the first rings comprising ferroelectric material;
   second rings extending around the first rings and comprising insulative material, the first and second rings are together being comprised by memory cells, the memory cells being arranged in horizontally-extending rows; and
   conductive shield panels extend through the stack and separate neighboring rows from one another.

14. The integrated assembly of claim 13 comprising third rings between the first and second rings; the third rings comprising conductive material.

15. The integrated assembly of claim 14 wherein the conductive material is metal-containing material.

16. The integrated assembly of claim 13 wherein the stack includes at least four of the vertically-stacked channel regions.

17. The integrated assembly of claim 13 wherein the stack includes at least eight of the vertically-stacked channel regions.

18. The integrated assembly of claim 13 wherein the stack includes at least 16 of the vertically-stacked channel regions.

19. The integrated assembly of claim 13 wherein the memory cells within a common row are horizontally spaced from one another by intervening regions, and wherein conductive shield structures extend through the stack in the intervening regions.

20. The integrated assembly of claim 19 wherein the conductive shield structures are configured as cylindrical posts.

21. The integrated assembly of claim 13 wherein:
   the memory cells are arranged in horizontally-extending rows;
   first conductive shield structures extend through the stack and separate neighboring rows from one another;
   memory cells within a common row are horizontally spaced from one another by intervening regions; and
   second conductive shield structures extend through the stack in the intervening regions.

22. The integrated assembly of claim 21 wherein the first and second conductive shield structures are coupled with a reference-voltage-source.

23. The integrated assembly of claim 21 wherein the first conductive shield structures are configured as panels.

24. The integrated assembly of claim 13 wherein:
the conductive gating structures are wordlines;
the first and second comparative digit lines are incorporated into paired sets, with each paired set including one of the first comparative digit lines and one of the second comparative digits and being coupled with sense-amplifier-circuitry; and
each of the memory cells being uniquely addressed through a combination of one of the wordlines and one of the paired sets.

25. The integrated assembly of claim 24 wherein the first comparative digit lines of the paired sets are coupled with driver circuitry.

26. The integrated assembly of claim 25 wherein the second comparative digit lines of the paired sets are coupled with a reference-voltage-source.

27. A method of forming an integrated assembly, comprising:
forming a stack to include insulative levels, digit line levels and channel levels; the digit line levels including first digit line levels and second digit line levels; the first and second digit line levels being in paired sets with each paired set having one of the first digit line levels and one of the second digit line levels; the channel levels being between the first and second digit line levels of the paired sets; the insulative levels being between the first and second digit line levels of vertically-neighboring paired sets;
forming openings to extend through the stack;
recessing the digit line levels and the channel levels selectively relative to the insulative levels to form cavities extending into the digit line levels and the channel levels;
lining the cavities with insulative material to narrow the cavities;
annealing the stack at a temperature of at least about 1000° C. for a duration of at least about 1 second;
after the annealing, forming ferroelectric material within the narrowed cavities; and
after forming the ferroelectric material, filling the openings with conductive material.

28. The method of claim 27 wherein the channel levels comprise silicon, and wherein the annealing forms an average crystalline grain size within the silicon of at least about 1 micron.

29. The method of claim 27 wherein the average crystalline grain size is at least about 10 microns.

30. The method of claim 27 further comprising forming conductive material within the narrowed cavities prior to forming the ferroelectric material.

31. The method of claim 27 comprising reestablishing the openings with one or more etches after forming the ferroelectric material.

32. The method of claim 27 wherein the openings are first openings and are formed in first locations; wherein the conductive material is first conductive material; and further comprising forming second openings between the first locations and filling the second openings with conductive shield material.

33. The method of claim 32 wherein the second openings are filled with the conductive shield material after the first openings are filled with the first conductive material.

34. The method of claim 32 wherein the second openings are filled with the conductive shield material as the first openings are filled with the first conductive material.

35. The method of claim 27 wherein the ferroelectric material is configured as rings surrounding the conductive material.

* * * * *